United States Patent [19]

Franz et al.

[11] Patent Number: 4,900,954

[45] Date of Patent: Feb. 13, 1990

[54] MIXED CML/ECL MACRO CIRCUITRY

[75] Inventors: Michael Franz, San Jose; Tsung C. Whang, Cupertino, both of Calif.

[73] Assignee: Siemens Components, Inc., Iselin, N.J.

[21] Appl. No.: 278,093

[22] Filed: Nov. 30, 1988

[51] Int. Cl.$^4$ ............... H03K 19/086; H03K 5/12; G06F 7/50

[52] U.S. Cl. .................... 307/455; 307/467; 307/471; 307/263; 307/272.1

[58] Field of Search ............... 307/443, 454, 455, 456, 307/465, 467, 471, 540, 263, 272.1

[56] References Cited

U.S. PATENT DOCUMENTS

| | | | |
|---|---|---|---|
| 3,916,215 | 10/1975 | Gaskill, Jr. et al. | 307/203 |
| 3,925,684 | 12/1975 | Gaskill, Jr. et al. | 307/203 |
| 3,925,691 | 12/1975 | Gaskill, Jr. et al. | 307/300 |
| 3,955,099 | 5/1976 | Gaskill, Jr. et al. | 307/218 |
| 4,276,488 | 6/1981 | Benedict et al. | 307/272 A |
| 4,580,066 | 4/1986 | Berndt | 307/276 |
| 4,628,217 | 12/1986 | Berndt | 307/467 |
| 4,727,265 | 2/1988 | Nanbu et al. | 307/443 |

FOREIGN PATENT DOCUMENTS

| | | | |
|---|---|---|---|
| 0063132 | 5/1980 | Japan | 307/455 |
| 0813785 | 3/1981 | U.S.S.R. | 307/455 |

OTHER PUBLICATIONS

IEEE 1988 Custom Integrated Circuits Conference, May 16–19, 1988 Franz et al.
Honeywell HE2000, Application #1.
Honeywell HE5000, Application #3.
"CML and flip TAB join forces in the DPS 88's micropackages", Electronics, No. 3, 1982, pp. 93 and 96.

Primary Examiner—Stanley D. Miller
Assistant Examiner—Margaret Rose Wambach
Attorney, Agent, or Firm—John Francis Moran

[57] ABSTRACT

A circuit technique is presented for mixing current mode logic and emitter coupled logic in a manner which reduces active and passive component counts for performing recognized logic functions. The reduced counts permit greater circuit density while reducing power consumption in comparison to conventional emitter coupled logic circuitry. The mixing is also provided in a way for making all imputs and outputs compatible with conventional emitter coupled logic levels. Various logic circuits are illustrated to demonstrate the versatility of the technique. For example, a transparent high D-latch (FIG. 2), a D flip-flop with true output (FIG. 4), a two-to-one multiplex latch (FIG. 6), and other D flip-flops having set and reset inputs (FIG. 7), multiplex data inputs (FIG. 8), and Exclusive OR data inputs (FIG. 9) are circuits wherein the inventive technique is employed to advantage.

20 Claims, 9 Drawing Sheets

FIG. 10

| FUNCTION | PASSIVE COMPONENTS | | | ACTIVE COMPONENTS | | |
|---|---|---|---|---|---|---|
| | ECL | CML/ECL | % REDUCED | ECL | CML/ECL | % REDUCED |
| TRANSPARENT HIGH D-LATCH | 5 | 4 | 20% | 13 | 11 | 15% |
| 2:1 MUX-LATCH | 9 | 6 | 33% | 24 | 18 | 25% |
| D FLIP-FLOP, TRUE OUTPUT | 9 | 7 | 22% | 24 | 20 | 17% |
| D FLIP-FLOP WITH SET AND RESET | 11 | 10 | 9.1% | 31 | 29 | 6.5% |
| D FLIP-FLOP WITH MUX DATA | 12 | 10 | 17% | 34 | 30 | 12% |
| D FLIP-FLOP WITH EXOR DATA | 12 | 10 | 17% | 34 | 30 | 12% |

MIXED CML/ECL MACRO CIRCUITRY

BACKGROUND OF THE INVENTION

This invention relates to logic circuitry for fabrication in customized integrated circuits, and it relates, more particularly, to circuit arrangements suitable for being integrated into basic building blocks also referred to as macros or macrocells in the context of semiconductor integrated devices of the types referred to as standard, semicustom, and full custom designs.

Gate arrays have been well-known in the art. More recently, gate arrays take the form of semiconductor integrated devices which are customizable by the user to form a plurality of customized electrical circuits. Each electrical circuit is a logic unit or a macro, such as a logic gate, (AND, NAND, OR, NOR, etc.) or a more complex logic unit such as latch, flip-flop, adder, etc. The gate arrays are customized both to form the logic units and to interconnect the logic units since there are several macros on a chip. Hereinafter, the customized connection to form a logic unit will be referred to as the intra-cell connection. The customized connection between the logic units or macros will be referred to as the inter-cell connection or wiring. In this context, the invention primarily concerns the intra-cell connections.

One of the more common forms of logic families in use is known as emitter-coupled logic (ECL). ECL circuitry provides one of the basic approaches in fabricating bipolar gate arrays. Some of the chief advantageous characteristics of practical implementations of ECL, usually in integrated circuit form, are: high speed since transistors do not saturate, high input resistance and very low output resistance for large fan out capability, very low noise generation, and the ability of using multiple levels of current switches (series gating) for complex logic functions. Notwithstanding the foregoing advantages compared to another logic family known as current-mode logic (CML), ECL has higher power dissipation and lower circuit density which requires greater area, "silicon real estate", on the chip for implementation.

CML is not as widely used as ECL, in spite of being well known, due to its disadvantage of lower driving capability. This disadvantage is apparent considering that one virtually never interfaces CML externally from an integrated circuit, but is now mainly a disadvantage within the chip itself due to high scales of integration complexity routinely utilized. In the latter situation, the distributed and parasitic capacitance involved severely detracts from the practical usefulness of CML.

SUMMARY OF THE INVENTION

It is a primary object of the present invention to provide ECL functions wherein additional CML circuitry is appropriately biased to reduce the requisite number of active devices and passive components as well as the associated power consumption compared to conventional ECL circuits.

A related object in ECL circuits is to eliminate an incompatibility of its collector output switching level and successive upper level inputs while obviating emitter followers for providing level-shifting interfaces between output and input levels, particularly between the internal stages of the logic circuits.

A further object is to increase logic density by using CML/ECL mixed design to increase logic capability for a given chip area.

A related object is to provide higher speed logic circuitry wherein the reduced area shortens metal interconnection paths for reduced parasitic loading effects.

A still further object is to provide a CML and ECL circuit combination capitalizing on the high density provided by CML and the high driver capability of ECL.

Broadly the invention takes the form of a general technique applicable to ECL circuit network wherein the requisite number of active devices and passive components are reduced by internally utilizing CML circuitry in logic building blocks having complete input and output compatibility with ECL circuitry. Both power consumption and area are reduced in the application of the inventive technique in standard logic functions implemented in circuitry of reduced complexity over that of conventional circuits.

Several illustrative embodiments of the invention are presented in a number of logic functions to demonstrate the versatility of the technique. In each case of the particular logic function being a latch, flip-flop either alone or coupled with gates in the form of exclusive OR gates or multiplexing gates, the employment of an upper level CML logic provides reduced device count including passive component count and their attendant power consumption over a conventional ECL circuit implementation for each case. As a result less chip area is required for the fabrication of each logic function while increasing speed of operation and flexibility in implementation. For another standpoint, the CML logic function provides an arrangement of direct coupling interfaces within itself and to the ECL circuitry. The illustrative embodiments standing collectively are only some of the number of arrangements possible in accordance with the invention.

The inventive technique of employing CML circuitry stages wherein outputs and inputs are compatible for direct connection and feedback is integrated into a multiple switching level cascode circuit. Typically, three switching levels are serially connected wherein two lower levels are emitter coupled logic switching gates and the upper level is formed of current mode logic switching gates. Since the inputs are presented to the two lower levels and emitter follower transistors provide level shifting and increased drive for outputs from the upper switching level, all inputs and outputs are directly compatible with conventional emitter coupled logic circuitry. However, the advantages of implementation of the upper level current mode logic reduces the member of active and passive components required for providing a number of recognized logic functions.

BRIEF DESCRIPTION OF THE DRAWING

Features of the invention and additional objects of the invention will be more readily appreciated and better understood by reference to the following detailed description which should be considered in conjunction with the drawing.

In describing the invention in order to facilitate an understanding of its application as a general technique to be used to advantage, a number of logic functions are presented first in conventional form and then in a form wherein the inventive technique is employed in a functionally equivalent arrangement. The equivalence not only applies to the logic function but also in terms of respective input and output levels.

FIG. 10 is a table comparing component counts in the described logic functions.

DETAILED DESCRIPTION

Figure 1:
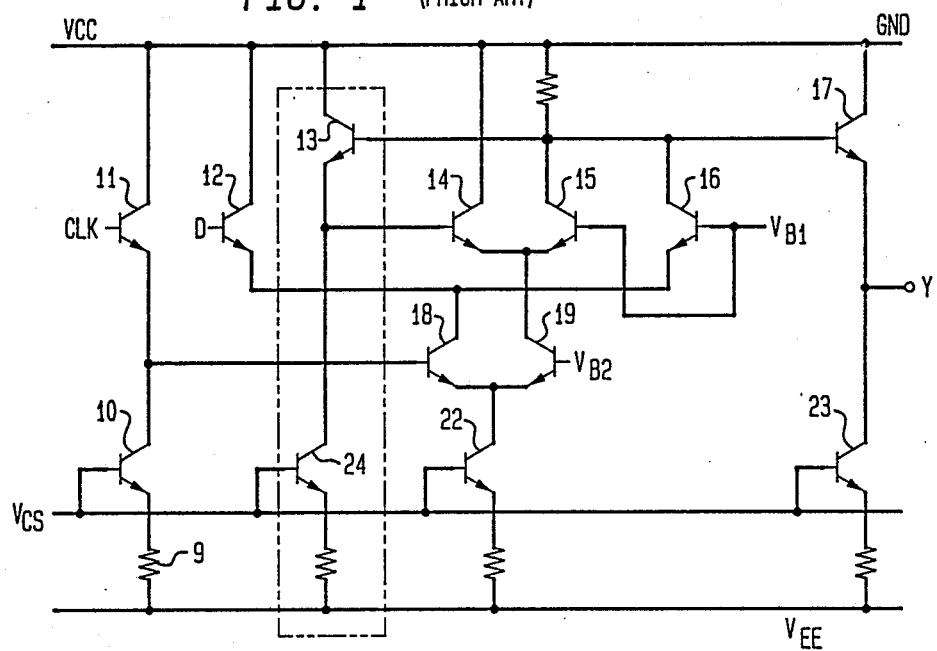
FIG. 1 is a schematic diagram of an ECL implementation of a transparent high D-latch.

A schematic diagram in FIG. 1 is presented for a conventional ECL transparent high D-Latch. The clock signal, CLK, drives transistor 11 while the data input signal is applied to input D or the base of transistor 12. The emitter, or common terminal, of transistor 11 is connected to a current source configured from transistor 10 biased at a fixed potential and connected via a resistor 9 to the $V_{EE}$ supply potential. There are four such current sources in the circuit of FIG. 1. In this case, the $V_{CC}$ supply potential is maintained at ground potential for reference signal purposes.

The basic latch operation involves transistors 14 and 15 which are positioned as an intermediate level current switching logic gate connected to a lower level current switching logic gate which includes transistors 18 and 19 and, more specifically, to the collector of transistor 19. The emitters of transistors 18 and 19 are connected together and to the current source of transistor 22. In order for the latch to function the collector of transistor 15 is coupled back to the base of emitter follower transistor 13 whose emitter is connected to the base of transistor 14 and the current source including transistor 24.

While a fixed bias potential $V_{B2}$ is applied to the base of transistor 19, another fixed bias potential $V_{B1}$ is applied to the base of transistors 15 and 16 which serve as reference transistors. The collectors of transistors 15 and 16 are coupled to the base of emitter follower output transistor 17 for producing an output Y. Output Y is also connected to the current source of transistor 23. Another current source of transistor 22 is connected to the common terminal of transistors 18 and 19. It should be pointed out that although input levels at terminals CLK and D as well as the output at terminal Y are all ECL logic levels, an internal level shifting operation is required in the form of the emitter follower of transistor 13 and its current source obtained from the collector of transistor 24.

Figure 2:
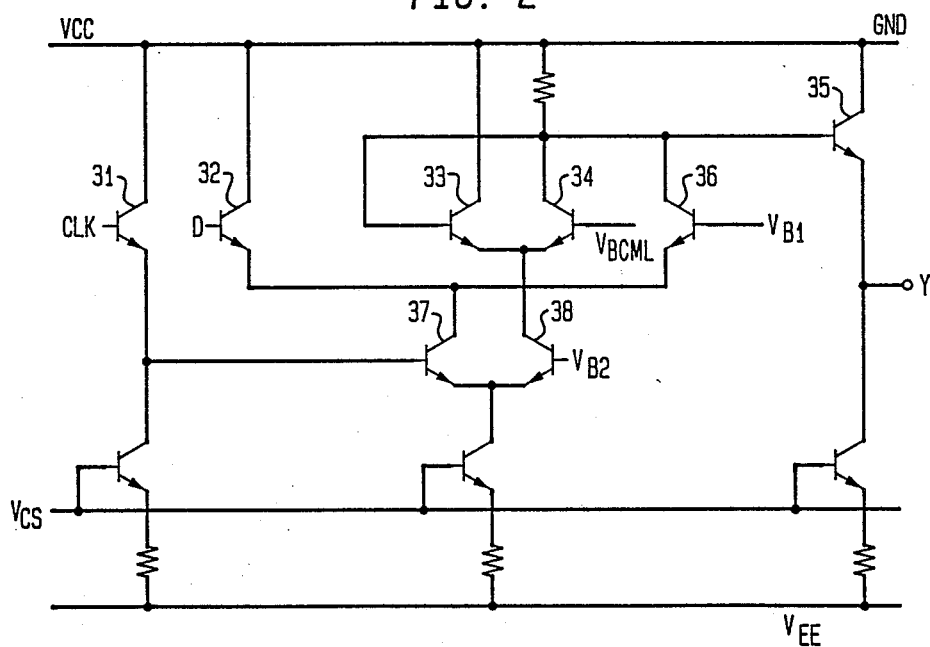
FIG. 2 is a diagram of a mixed CML/ECL implementation in accordance with the invention of a functionally equivalent transparent high D-latch.

In FIG. 2, a D-latch circuit utilizing mixed CML/ECL circuitry reduces the number of transistors, resistors, and current sources over a functionally equivalent conventional ECL latch circuit. The heart of the latch comprises CML operated transistors 33 and 34. The collector of transistor 34 is fed back directly to the base of transistor 33 to produce the characteristic latch function. A fixed bias voltage source, designated $V_{BCML}$, is applied to the base of transistor 34 which may also be considered as a reference transistor while transistor 33 is considered as an input transistor. When a data signal is applied to the input D (base of transistor 32) and the clock input signal, CLK, is high at the base of transistor 31, the current switch including transistors 32 and 36 replicates or takes on the value of the data signal input state at the collector of transistor 34.

When the clock signal, CLK, switches to a low logic state, the latch of transistors 33 and 34 serves to maintain and retain the logic state level present at the collector of transistor 34, regardless of any changes which occur at input D. The emitter of transistor 31 follows a low CLK input and drives the base of transistor 37 low. Transistor 37 is also turned off and inhibits the operation of D input while transistor 38, or the reference transistor, is turned on to maintain the states of transistors 33 and 34. An emitter follower in the form of transistor 35 translates the internal CML logic voltage levels to the standard ECL logic output levels wherein the low driving impedance and high fanout capability are exhibited.

In the comparison of the functionally equivalent circuits of FIGS. 1 and 2, it is apparent that the dashed line boxed circuitry of transistors 13 and 24 including the series resistor is all eliminated. Furthermore, the power dissipation consumed by these devices is also eliminated. It will become apparent that the approach of FIG. 2 provides a general technique for reducing the required transistors and resistors for producing standard logic functions wherein a further saving in power consumption is also apparent.

With respect to the circuitry of FIGS. 1 and 2 and consistent throughout the circuitry to be described hereinafter, the voltage potential levels and signal levels are presented which apply at fifty degrees Centigrade. The powering potential $V_{EE}$ is $-4.5$ volts. The signal voltage swing is 0.55 volts. For CML the logic high level is $V_{OH}$ which corresponds to zero volts while the logic low level $V_{OL}$ is $-0.55$ volts. The logic low level, $V_{OL}$, equals $-1.350$ volts and the logic high level $V_{OH}$, equals $-0.800$ volts for ECL circuitry. A potential value of $-1.073$ volts is applied for $V_{B1}$ in CML and in ECL. For $V_{b2}$ in CML and in ECL the potential value is $-1.844$ volts. For CML and for ECL, $V_{CS}$ are both $-3.135$ volts. Finally, the CML reference bias level is $V_{BCML}$ equals $-0.280$ volts. It is pointed out that the absolute voltage levels are not as important as providing a compatible relationship between CML and ECL circuitry potential levels.

Figure 3:
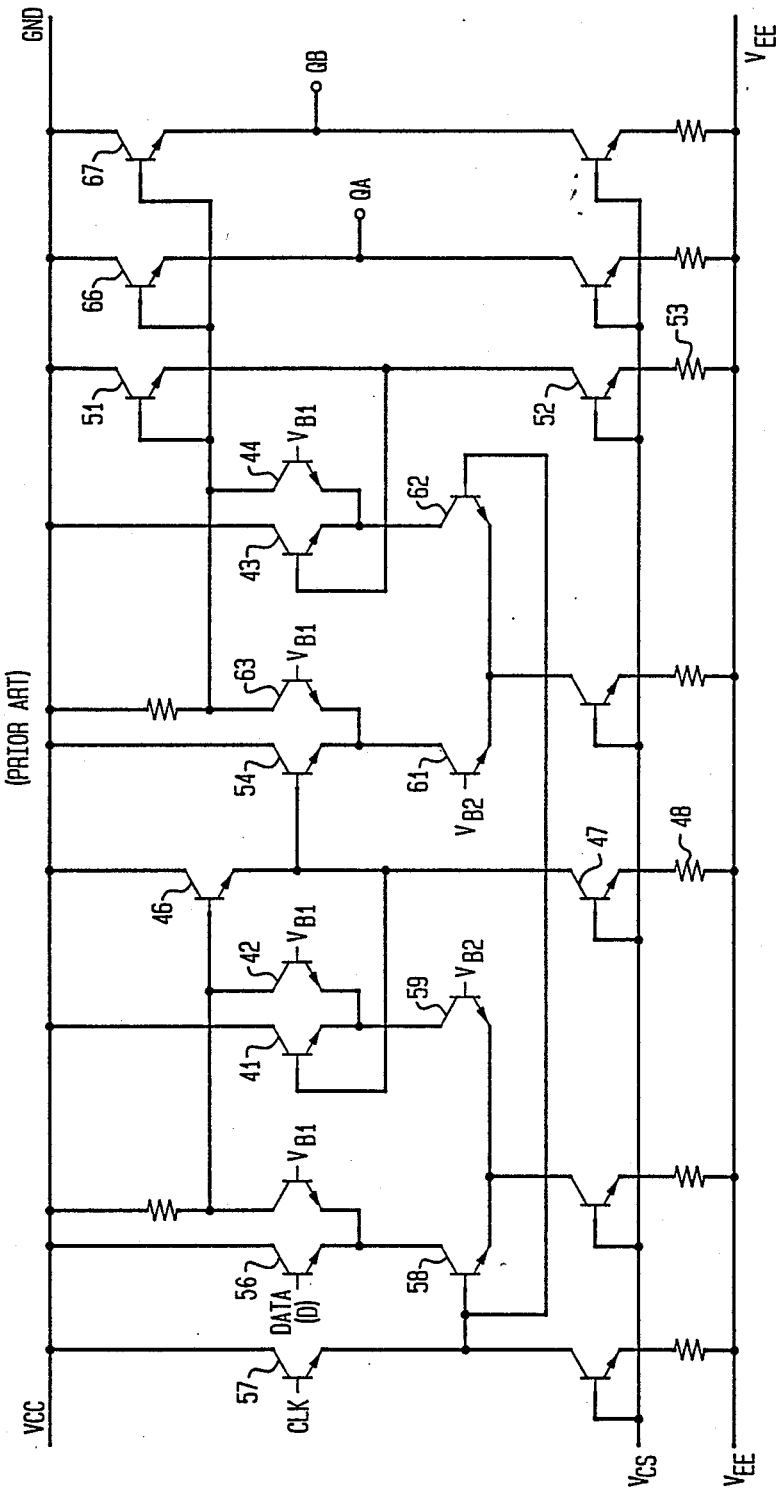
FIG. 3 provides a schematic of a D flip-flop having a true output in conventional ECL design.

FIG. 3 is a schematic diagram of a D flip-flop which basically includes two latches. The first stage is a switching gate of transistors 41 and 42 and is also referred to as a master latch. The second stage, also a switching gate, includes transistors 43 and 44 commonly called a slave latch. In the master latch, the collector signal level on transistor 42 is fed back to the base via level shifter, emitter follower, transistor 46 which requires a current source in the form of transistor 47 and resistor 48. Similarly, the slave latch requires a fed back level shift in the form of emitter follower transistor 51 along with the current source of transistor 52 and resistor 53.

The signal from emitter follower transistor 46 is also applied to the base of transistor 54 which serves as a slave latch input. When the data signal is applied to input D at the base of transistor 56 and the clock signal applied to the CLK input at the base of transistor 57 is a logical high level, the lower level current switch in the form of transistors 58 and 59 replicates the data input state at the collector of transistor 42 and at the base of transistor 54 which provides the slave latch input. Then, when the clock signal applied to the CLK input switches to a low level, the current switch of transistors 61 and 62 replicates the slave latch input signal level at the collector of transistor 44 due to the state of transistor 63. Emitter follower transistors 66 and 67 whose bases are driven by the collector signal from transistor 44 provide the circuit outputs. The latch circuits retain the logic state present at the collectors of transistors 42 and 44 regardless of any changes at input D when the clock signal is low for the master latch and high for the slave latch respectively.

Figure 4:
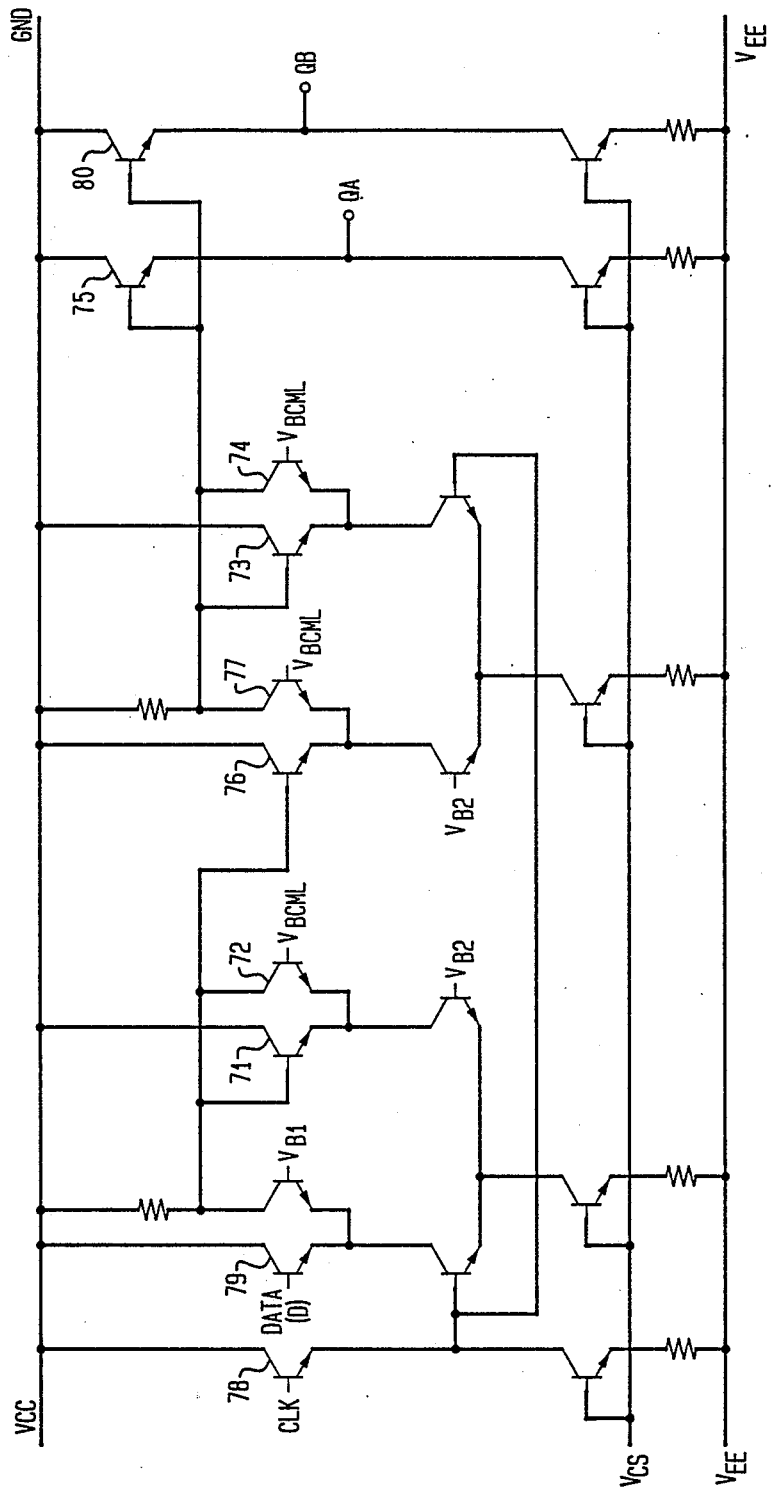
FIG. 4 is a mixed CML/ECL schematic of a D flip-flop in accordance with the invention.

FIG. 4 provides a schematic diagram of a circuit functionally equivalent to the D flip-flop of FIG. 3 while reducing the number of active and passive components. In FIG. 4, it should be noted that the master latch of transistors 71 and 72 and the slave latch of transistors 73 and 74 and the input of the slave latch which includes transistors 76 and 77 are implemented in CML form. Hence, their output and input signal levels are compatible for direct connection between the respective collectors and bases of the transistors therein. Accordingly, level shifting functions in the form of emitter follower transistors and their respective current sources of a transistor and a resistor are no longer required. Emitter follower transistors 75 and 80 provide ECL level outputs responsive to the level at the collector of transistor 74 which are related to the CLK and data signals applied to transistors 78 and 79 in accordance with the D flip-flop operation. The circuit of FIG. 4 provides the related benefits of a reduced component count, reduced fabrication area, and lower power consumption compared to that of FIG. 3.

When data are applied to input, D, and the clock input, CLK, is high, the lower level current switch replicates the data input state at the collector of transistor 72 and the base of transistor 76 which is the slave latch input. Then, when the clock, CLK, switches to low, the lower level current switch replicates the slave latch input at the collector of transistor 77. Emitter followers in the form of transistors 75 and 80 provide two concurrent outputs. The latch circuit function retains the logic state on the collectors of transistors 72 and 74 regardless of any changes at the input while their respective current sources are active.

Figure 5:
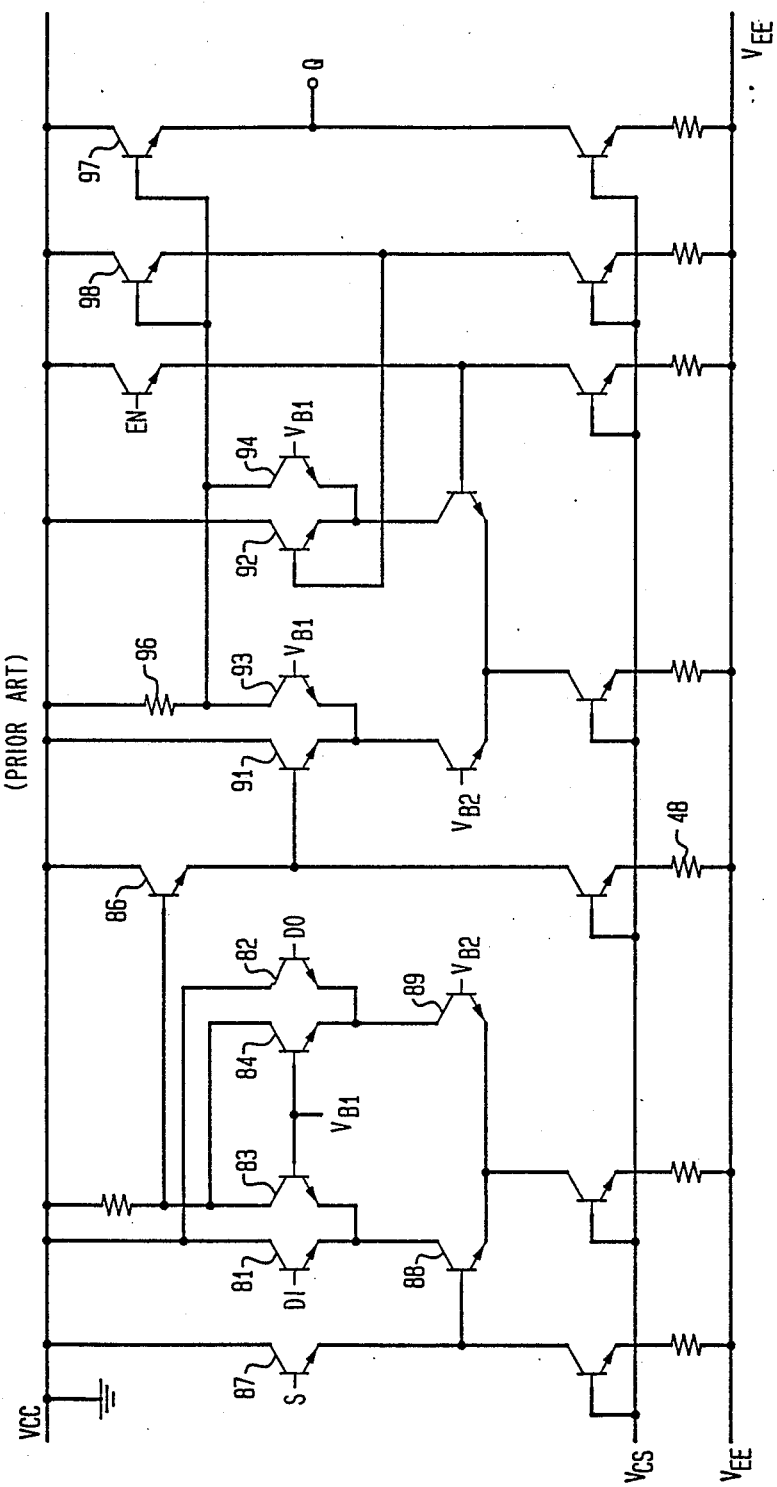
FIGS. 5 and 6 are respective ECL and CML/ECL versions of a two-to-one multiplex latch.

FIG. 5 is a schematic diagram of a conventional 2:1 multiplex (mux) latch wherein a 2:1 mux is followed by a D-latch. The multiplexer includes a two-level series gating cascode formed by the interconnection of transistors 81-84 operating directly at the data input level along with transistors 88 and 89 which function as the lower current switch. While transistor 89 is the reference or bias device, transistor 87 serves as a level shifter for the select input wherein the operation of transistors 88 and 89 selects the data inputs, D0 or D1 for the pair of upper current switching transistor pairs, 82, 84 and 81, 83 respectively wherein transistors 83 and 84 are the bias or reference devices. The selected input signal appears on the collectors of transistors 83 and 84 and is then level-shifted by transistor 86 to serve as the data input for the latch.

The latch portion of the circuit of FIG. 5 has the data input from transistor 86 applied to the base of transistor 91 whose collector is tied to $V_{CC}$. Transistor 92 is in the feedback path of the latch. Bias transistors 93 and 94 have their emitters respectively coupled to the emitters of transistors 91 and 92. The collectors of transistors 93 and 94 share a common load resistor 96 to produce the output via emitter follower transistor 97 and the input to the feedback path via the base of transistor 98 whose emitter is connected to the base of transistor 92.

When the enable (EN) input is low, the latch is transparent and the output (Q) is controlled by the data inputs (D1 and D0) of the multiplexer. When the EN input is high, the Q output is latched to maintain the state present before the occurrence of the transition at the EN input.

Figure 6:
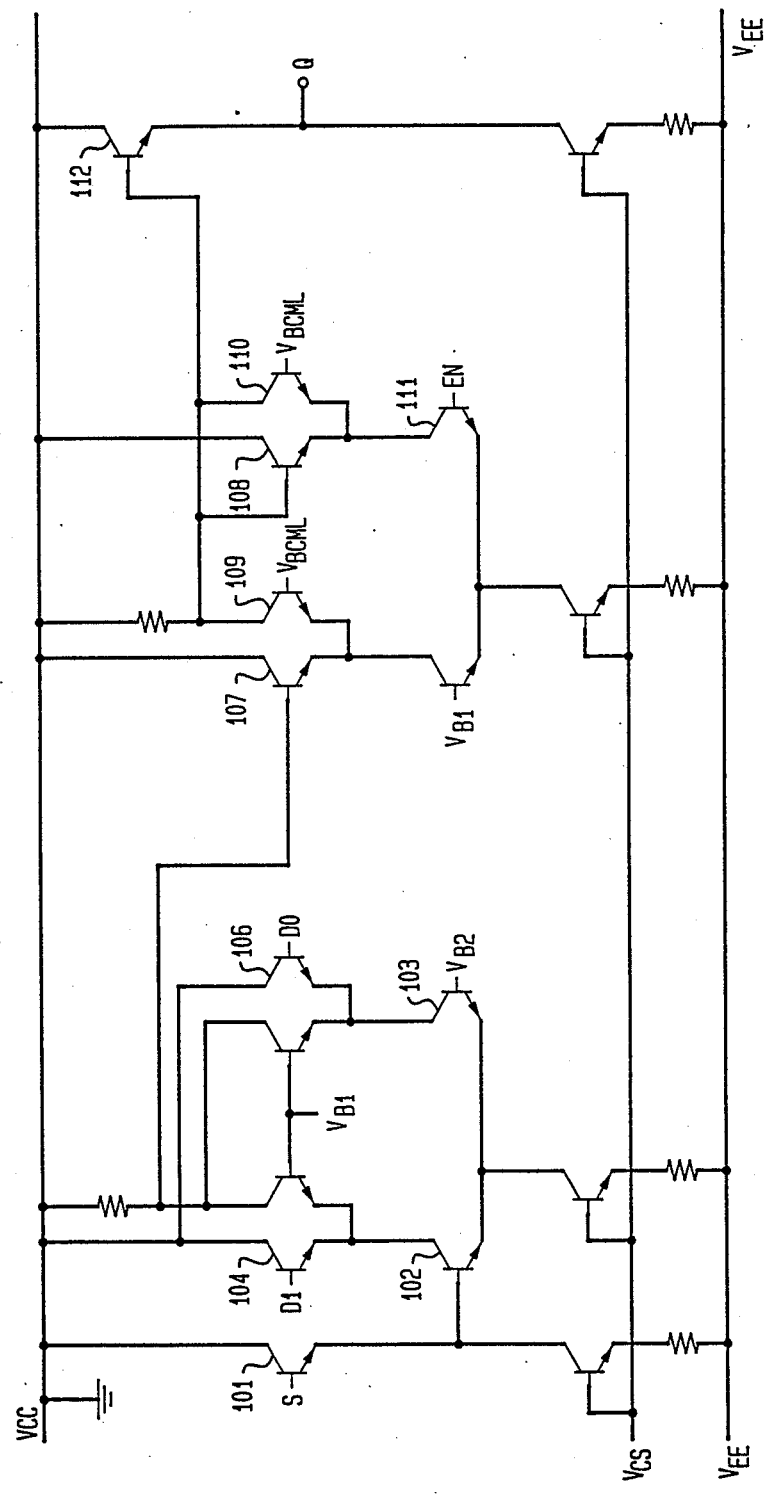

FIG. 6 provides the CML/ECL mixed version of a 2:1 mux latch in accordance with the present invention. The select (S) input is applied to transistor 101 which is in turn connected to drive transistor 102. Transistor 102 is one of a pair of transistors 102 and 103 serially connected to data input transistors 104 and 106 of multiplex gate. However, by virtue of the latch circuit portion of transistors 107-110 operating at an appropriate level in the CML mode, these transistors directly interface with the output of the gate and also do not require a level shift feedback since the collector of transistor 109 is coupled directly to the base of transistor 108.

In the circuit of FIG. 6, the enable (EN) input is applied to the base of transistor 111 while the circuit output is provided by the emitter of transistor 112. The arrangement of FIG. 6 is functionally equivalent to that of FIG. 5 including the ECL level inputs and circuit output. In a component count comparison of Figs. 5 and 6, it is apparent that three level shifters are eliminated along with their associated current sources.

The remaining flip-flop circuits in accordance with the principles of the present invention provide reduced active and passive component counts over that of conventional ECL circuit implementations through the process of eliminating level shifters/emitter followers and their associated current sources. Externally, these circuits provide inputs and outputs which are standard ECL signal logic levels and for all intensive operational purposes are "standard ECL" circuits except for reduced component count as well as chip area and reduced power consumption. The reduced complexity also provides the added benefit of increased processing yield.

Figure 7:
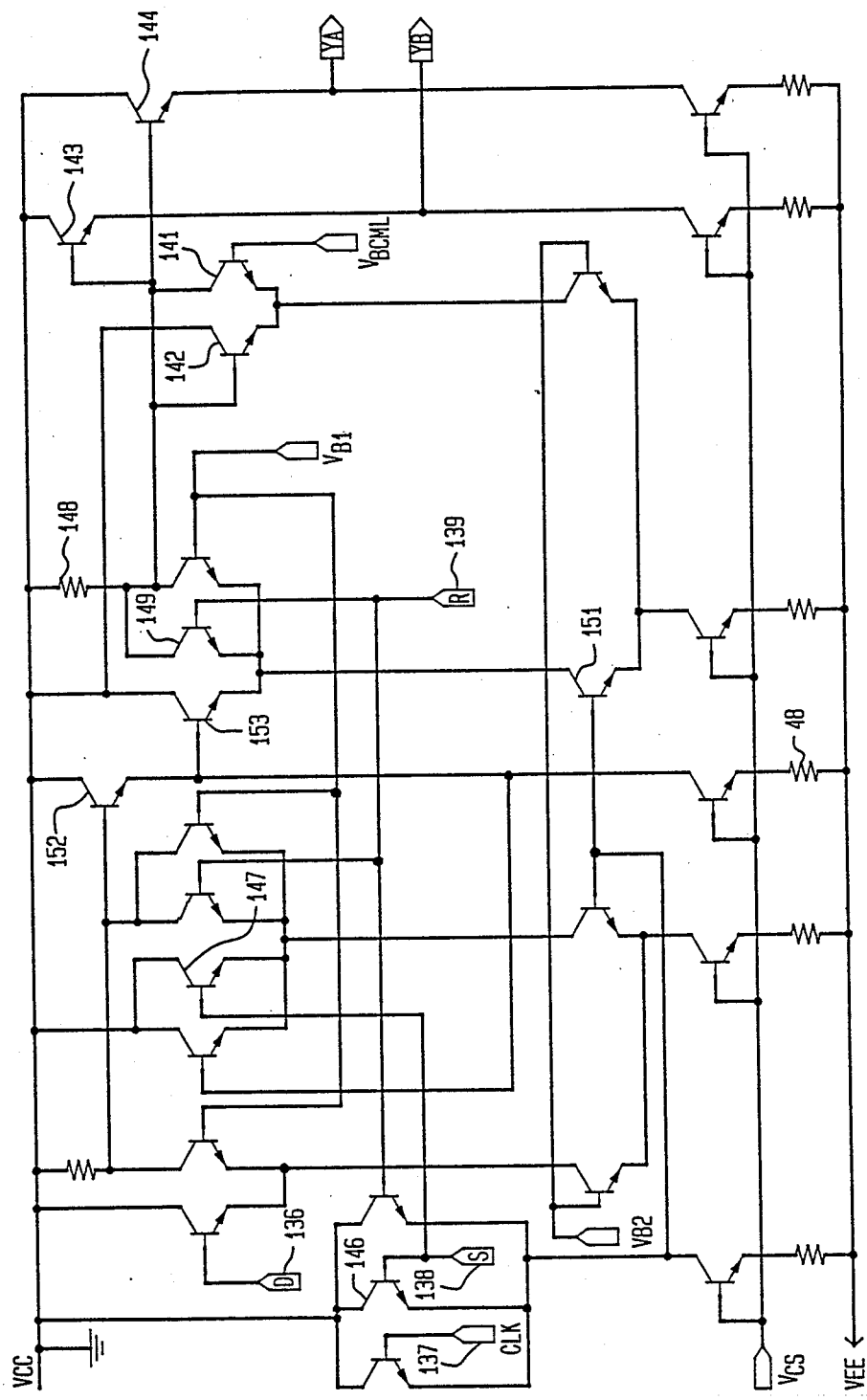
FIG. 7 illustrates a D flip-flop with set and reset inputs in mixed CML/ECL circuitry.

FIG. 7 provides a schematic diagram of a D flip-flop with set and reset inputs. Input 136 is for data; input 137 is for the clock signal; and input 138 serves as a set input while input 139 serves as the reset input. Except for the operational features of the set and reset inputs, the operation of this circuit corresponds to that of a basic D flip-flop. The set and reset inputs require additional signal levels, thus only the slave latch circuit is implemented in the CML/ECL mixed circuit technique in the form of transistor pair 41 and 142 as present in FIG. 7. The collector of transistor 141 is fed back to the base of transistor 142 to provide the latch function. Emitter followers in the form of transistors 143 and 144 translate the internal CML to the standard ECL at the circuit outputs.

In operation when the data input is high, then transistors 151 and 149 are turned on and the current flow path includes resistor 148, transistors 149 and 151. A voltage drop is thus produced across resistor 148, and the bases of output transistors 143 and 144 are tied to resistor 148. Accordingly, outputs YA and YB are reset to a logic low level.

If the set input goes high, then transistors 146 and 147 are turned on and the current flows from V$_{cc}$ via transistors 146 and 147. The output of transistor 152 corresponds to a high level state which switches on transistors 153 and 151. The current now flows from V$_{cc}$ through transistors 151 and 153. Since there is no current flow present through resistor 148, the YA and YB outputs are set at output high logic levels. When the reset input goes high, the YA and YB outputs are switched to a logic low level. In the case of both the set input 138 and the data reset input 139 are both at logic high levels, the outputs are undetermined.

Figure 8:
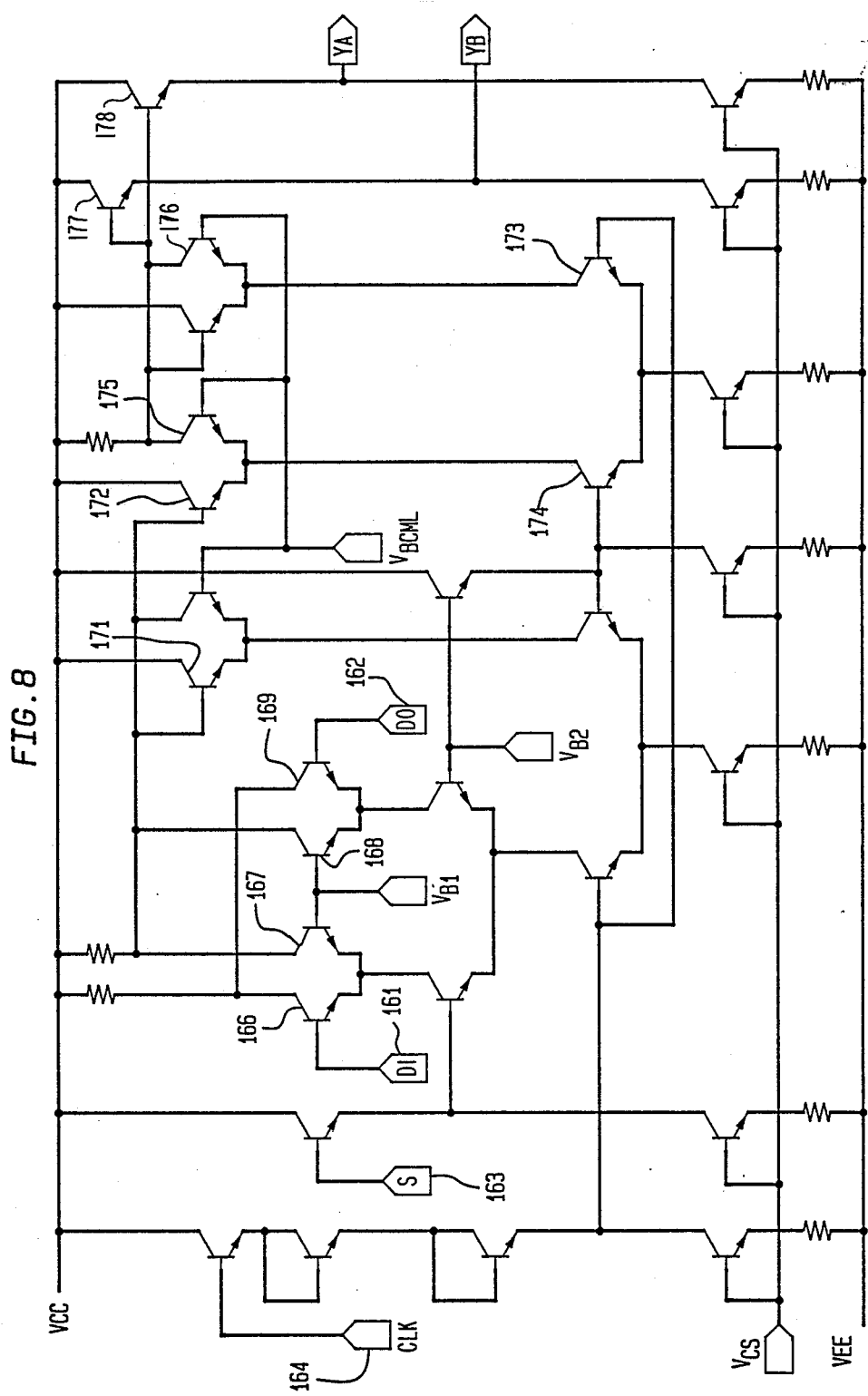
FIG. 8 is a schematic diagram of a D flip-flop circuit employing a multiplex data input.

FIG. 8 is a schematic of a D flip-flop with a multiplex data input arrangement. The data inputs are 161 and 162 with input 163 receiving the select signal while input 164 has the clock applied to it. The basic operation corresponds to that of a D flip-flop. The multiplex arrangement includes transistors 166, 167, 168 and 169 and becomes active when the clock signal at input 164 is high. The effective data input to the flip-flop may correspond to that at input 161 or input 162 in accordance with the level of the select input 163. The selected input appears at the collectors of transistors 168 and 167, the base of transistor 171 in the master latch, and the base of transistor 172 which is the slave latch input. When the clock signal is low, the lower current switch of transistor pair 173 and 174 replicates the slave latch input at the collector of transistor 176. Emitter follower transistors 177 and 78 provide level shifting for translating the internal CML signal levels to the standard ECL levels.

Figure 9:
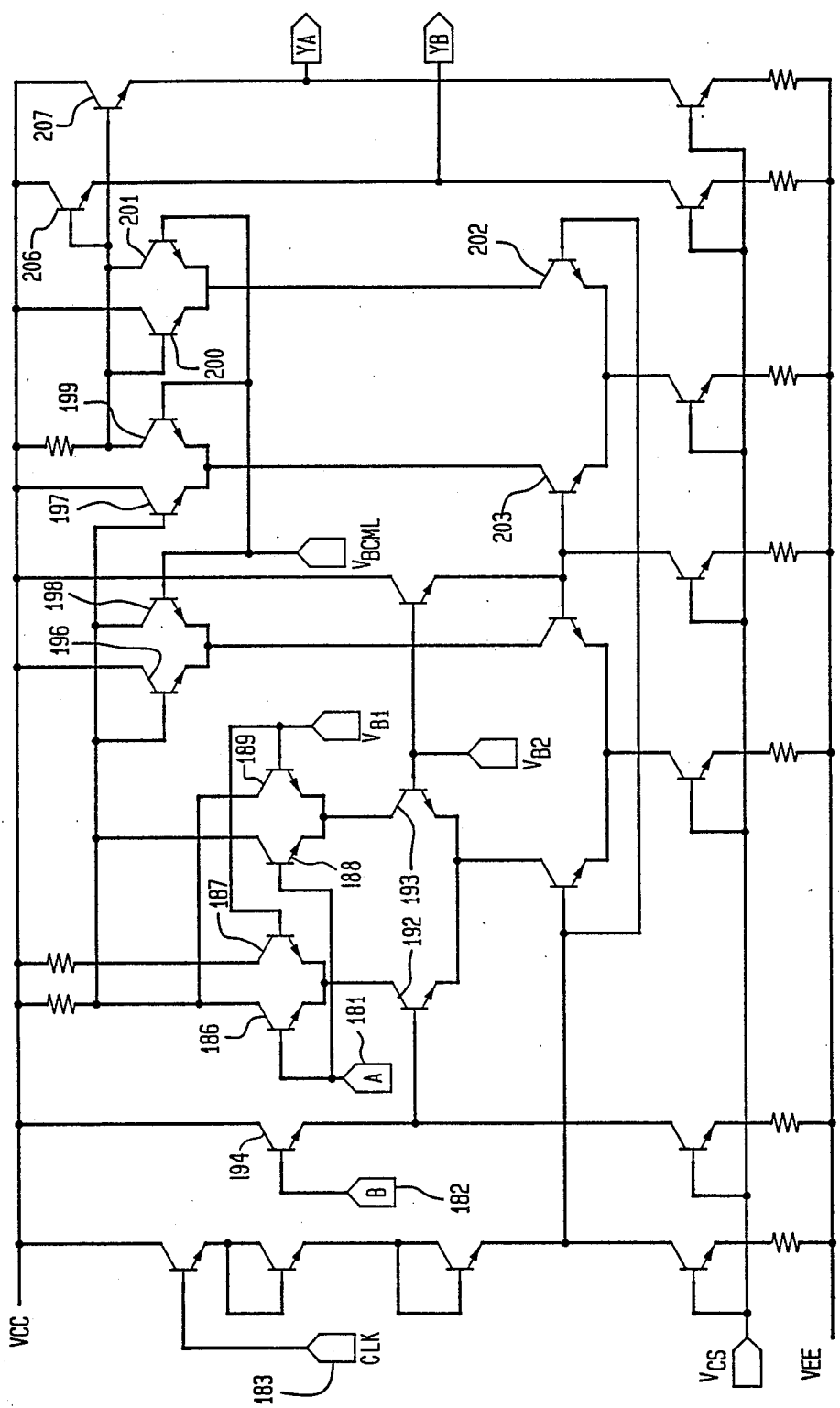
FIG. 9 illustrates a circuit in mixed CML/ECL form of a D flip-flop with Exclusive OR data inputs.

In FIG. 9, a schematic diagram of a D flip-flop with Exclusive OR data inputs is presented in accordance with the inventive principles. Inputs 181 and 182 are the data inputs which are Exclusive OR'ed together while the clock signal is applied to input 183. The basic operation of the flip-flop itself corresponds to that of FIG. 8. The implementation of the Exclusive OR gate includes transistors 186, 187 in a first pair, transistors 188 and 189, lower current switching transistors 192 and 193 of which transistor 192 receives a data signal from emitter follower transistor 194.

This functional logic, Exclusive-OR, may be considered as embedded within the flip-flop. The Exclusive OR gate operates when the clock signal is high. The collector of transistor 186 provides the output signal of the logic circuitry. This output stays at a CML high logic state level only when either one of data inputs 181 or 182 is high. Otherwise, this output maintains a CML low logic level. The output of Exclusive OR logic also is applied to the base of transistor 196 in the master latch and the base of transistor 197 in the slave latch. Transistors 196-201 operate and are interconnected as CML circuitry. When the clock signal is low, the current switch of transistors 202 and 203 replicates the slave latch input at the collector of transistor 199. Transistors 206 and 207 connected as emitter followers translate the internal CML signal levels to standard output ECL logic level signals.

FIG. 10 is a table depicting a comparison in counts of passive and active components between conventional ECL circuitry and mixed CML/ECL circuitry for a number of frequently used logic functions. It is now recognized that the benefit is most apparent in logic functions having some depth in terms of implementation in CML circuitry wherein inversion is not required and direct interfacing is provided between input and output stages.

There has thus been shown and described a number of novel mixed circuitry arrangements which fulfill all the objects and advantages sought therefor. Many changes, modifications, variations and other uses and applications of the subject invention will, however, become apparent to those skilled in the art after considering this specification and the accompanying drawing which disclose the preferred embodiments therefore. In addition to the modifications already mentioned or alluded to in the foregoing, other logic macro configurations may be used in addition to the disclosed configurations. Furthermore, the arrangements disclosed herein may be combined to also include different logic functions. For example, flip-flops and appropriate gating circuitry may be combined to serve as multiple bit shift registers. All such changes, modifications, variations and other uses and applications which do not depart from the spirit and scope of the invention are deemed to be covered by the invention which is limited only by the claims which follow.

We claim:

1. A logic network having a plurality of levels including at least one first lower current switching circuit and at least one second upper current switching circuit, each circuit comprising at least one input transistor and a reference transistor, each transistor having a base, an emitter, and a collector, the emitters of transistors in each current switching circuit connected in common together, the collector of an input transistor in each first lower current switching circuit connected to the common of a second upper current switching circuit, means for applying input signals to the bases of input transistors, means for applying first and second reference levels respectively to the base of a reference transistor in each of the at least one first lower current switching circuit and each of the at least one second upper current switching circuit, means for providing an output from at least one collector of a transistor in one second upper current switching circuit the logic network comprising: a CML logic level including at least one CML current switch above the at least one second upper current switching circuit, each CML current switch including at least one input CML transistor and a reference CML transistor, each CML transistor having a base, an emitter, and a collector, the base of each reference CML transistor being biased at an additional reference level above the second reference level, and each CML transistor in a CML current switch having their emitters connected in common together and to a selected collector of the at least one first lower level current switching circuit, an output of each CML current switch provided at a collector of one of its CML transistors, the base of each input CML transistor in the at least one CML current switch being an input for direct connection to a selected output of the second upper level current switching circuit and the CML current switch whereby multiple CML current switches are cascaded by having inputs and outputs directly connected together.

2. The logic network of claim 1 in integrated form on a single silicon substrate including CML current switches in a logic building block termed a macro.

3. The logic network of claim 1, further comprising biasing means producing a difference between the additional reference level and the second reference level corresponding to a forward potential drop across a silicon PN junction for matching input and output signal levels for CML current switches to signal levels of the outputs of the upper current switching circuit.

4. The logic network of claim 2, further comprising biasing means for the reference transistors in the CML current switches, and biasing means for the reference transistors in the lower current switching circuits, and input means for level shifting input signal levels of the inputs to those of the lower level current switching circuits and the output means for level shifting from output signal levels of the outputs of CML current switches and the outputs of upper level current switching circuits wherein the output means are signal level compatible with the input means.

5. The logic network of claim 4, wherein an emitter follower transistor comprises each of the input means and each of the output means.

6. The logic network of claim 4, further comprising biasing means for the reference transistors in the upper current switching circuits at a potential difference from that of the biasing means for the lower current switching circuits approximately corresponding to a forward potential drop across a silicon PN junction such that CML and ECL reference levels are all one diode voltage drop apart enabling the first ECL reference level equaling the second CML voltage level while a third CML reference level equals the second ECL reference level where an nth CML reference level equals an n-1st ECL reference level and where the logic level swings corresponds to about one diode drop of no more than 0.8 volts.

7. A bipolar integrated logic circuit comprising:
a first plurality of transistors each having an input terminal, an output terminal, and a common terminal;
a first current switching logic gate including a first and second transistor of the first plurality wherein the common terminals are connected together, first means for applying a first input signal to the input terminal of the first transistor, and input terminal of the second transistor being biased by a first bias potential, one polarity of a powering potential source is applied to the output terminals;
a second current switching logic gate including a third and a fourth transistor having their common terminals connected to a current source potential coupled to receive another polarity of the powering potential source, and the third transistor having its input responsive to a second input signal and its output terminal connected to the common terminal of the first logic gate, the input terminal of the fourth transistor being biased by a second bias potential; and
a third current switching logic gate including a fifth and a sixth transistor wherein the common terminals are connected together and to the output terminal of the fourth transistor, the input terminal of the fifth transistor is connected directly to the output terminal of the second transistor while the output of the sixth transistor provides a logic signal, the input terminal of the sixth transistor being biased by a third bias potential source above the second bias potential.

8. The bipolar integrated logic circuit according to claim 7, further comprising a resistor connected between the one polarity of the powering potential source and the output terminal of the sixth transistor.

9. The bipolar integrated logic circuit according to claim 8, wherein the output terminal of the sixth transistor is connected to the input terminal of the fifth transistor while the first input signal is a data signal and the second input is a clock signal and the first plurality of transistor cooperate as a transparent high D-latch.

10. The bipolar integrated logic circuit according to claim 9, further comprising:
a seventh transistor for receiving the clock signal at its input terminal and applying the clock signal to the second input via its emitter terminal, and a current source connected between the emitter terminal of the seventh transistor and the other polarity of the powering source; and
at least one emitter-follower transistor each having an input terminal connected to the output terminal of the sixth transistor, a collector terminal connected to the one polarity while an emitter terminal is coupled to the other polarity via a current source and provides the overall circuit output whereby all inputs and the output are compatible for direct connection to emitter coupled logic circuitry.

11. The bipolar integrated logic circuit of claim 9, further comprising:
multiplexing means having a first data input, a second data input, an output, and a select input determining whether the first data input appears at the output or the second data input appears at the output, the output of the multiplexing means provides the first input signal to the first transistor while an enable signal serves as the second input signal whereby the combination of the multiplexer means and the first plurality of transistors provide two-to-one multiplex latch logic operation.

12. The bipolar integrated logic circuit of claim 10, wherein all the transistors are NPN transistors, the one polarity is at ground potential while the other polarity is negative, the third bias potential is closer to ground potential than the first bias potential, the second bias potential is closer to the other polarity than the second bias potential which is approximately half of a potential difference between the second and third bias potentials.

13. The bipolar integrated logic circuit of claim 10, wherein each current source comprises a transistor having its collector-emitter current path providing a current for the current source, its emitter is coupled to the other polarity of the powering potential source via a resistor and its base is biased at a fourth bias potential closer than the second bias potential to that of the other polarity of the powering potential source.

14. The bipolar integrated logic circuit of claim 8, further comprising:
a second plurality of transistors corresponding in number to that of the first plurality and being interconnected in the same manner and having two inputs and an output, one input receiving the clock signal and the other input receiving the logic signal while the output being an overall output wherein the first plurality of transistors cooperates as a master latch while the second plurality of transistors cooperates as a slave latch and the overall output corresponds to that of a D flip-flop.

15. The bipolar integrated logic circuit of claim 8, further comprising:
a plurality of output emitter-follower transistors each having an input terminal coupled to the output terminal of a sixth transistor in the second plurality, an emitter terminal serially connected to a current source to provide an overall circuit output, and a collector terminal receiving the one polarity of the powering potential source.

16. The bipolar integrated logic circuit of claim 7, further comprising:
- resetting means having a set input, a reset input, a clock input, and an output coupled to the input of the fifth transistor, said resetting means controlling the logic output of the sixth transistor in response to its set and reset inputs;
- master latching means having a data input, a set input responsive to the set input of the resetting means, and an output coupled to the input of the fifth transistor, said master latching means retaining the state of its data input and controlling the input to the input terminal of said fifth transistor; and
- the output terminal of the sixth transistor is connected to the input terminal of the fifth transistor and to the one polarity via a resistor to provide feedback so that the fifth and sixth transistors operate as a slave latch while the combination of the resetting means and the master latching means serves as a set and a reset flip-flop.

17. The bipolar integrated logic circuit of claim 14, further comprising:
- multiplexing means having two data inputs, a select input, a clock input, and an output coupled to the input terminal of the first transistor of the second plurality, the multiplexing means for using one of its two data inputs in accordance with the select input to control its output and the input to the slave latch whereby the overall circuit cooperates to operate as flip-flop having two multiplexed data inputs.

18. The bipolar integrated logic circuit of claim 14, further comprising:
- exclusive ORing means having two data inputs, a clock input, and an output coupled to the input terminal of the first transistor of the second plurality, said exclusive ORing means responsive to its data inputs when the clock input is high and provides a high logic level at its output when its data inputs differ and otherwise provides a low logic level at its output whereby the combination of the first and second plurality of transistors and the exclusive ORing means cooperate to serve as a flip-flop having exclusive ORed data inputs.

19. A logic circuit having a lower level switching gate, an intermediate level switching gate, and a first upper level switching gate, each gate comprising at least one input transistor and a reference transistor, a common terminal of each transistor in each switching gate connected together,
- the lower level and intermediate level switching gates having the bases of one of its input transistors connected to receive input signals, the bases of the two reference transistors of the lower and intermediate circuits respectively being individually connected to a first bias potential and a second bias potential, the collector of the input transistor of the lower level switching gate connected to the common terminals of the transistors in the intermediate level switching gate, and
- the upper current switching gate including an input transistor and a reference transistor whose base is connected to a third bias potential, their common terminals are connected together and to the collector of the reference transistor of the lower gate, the base of the input transistor is connected directly to the collector of the reference transistor of the intermediate level switching gate, and the collector of the reference transistor is coupled to the base of the input transistor and provides a logic signal whereby the logic circuit operates as a latch circuit.

20. The logic circuit of claim 19, further comprising:
a second upper level switching gate and a third upper level switching gate, each switching gate comprising at least one input transistor and a reference transistor having their common terminals connected together, the base of the input transistor of the second upper level switching gate is connected to the collector of the reference transistor of the first upper level switching gate and the collector of the reference transistor of the second upper level switching gate connected via a load impedance to one polarity of a powering potential, the base of one input transistor of the third upper level switching gate is connected directly to the collector of the reference transistor of the third upper level current switching gate while the collector of the reference transistor provides the logic circuit output signal whereby the overall circuit operates as a D flip-flop wherein the first mentioned upper level switching gate operates as a master latch while the second and third upper level switching gates operates as a slave latch.

* * * * *